(12) United States Patent
Rudeck et al.

(10) Patent No.: US 7,015,111 B2
(45) Date of Patent: Mar. 21, 2006

(54) USE OF SELECTIVE OXIDATION TO FORM ASYMMETRICAL OXIDE FEATURES DURING THE MANUFACTURE OF A SEMICONDUCTOR DEVICE

(75) Inventors: Paul J. Rudeck, Boise, ID (US); Don C. Powell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/697,837

(22) Filed: Oct. 28, 2003

(65) Prior Publication Data

US 2005/0090061 A1    Apr. 28, 2005

(51) Int. Cl.
*H01L 21/76* (2006.01)
(52) U.S. Cl. .............. 438/423; 438/449; 438/530; 438/766; 438/773; 438/981
(58) Field of Classification Search ............... 438/423, 438/449, 530, 766, 773, 981
See application file for complete search history.

(56) References Cited

U.S. PATENT DOCUMENTS

| | | | | |
|---|---|---|---|---|
| 4,409,723 A | | 10/1983 | Harari | 29/571 |
| 5,102,814 A | * | 4/1992 | Woo | 438/263 |
| 5,115,296 A | * | 5/1992 | Hsue et al. | 257/344 |
| 5,192,872 A | | 3/1993 | Lee | 257/315 |
| 5,382,534 A | | 1/1995 | Sheu et al. | 437/35 |
| 5,445,984 A | * | 8/1995 | Hong et al. | 438/261 |
| 5,604,366 A | | 2/1997 | Lee | 257/316 |
| 5,684,317 A | * | 11/1997 | Hwang | 257/316 |
| 5,814,853 A | | 9/1998 | Chen | 257/315 |
| 6,251,751 B1 | | 6/2001 | Chu et al. | 438/439 |
| 6,372,663 B1 | * | 4/2002 | Yeh et al. | 438/773 |
| 6,461,915 B1 | | 10/2002 | Rudeck | 438/257 |
| 6,541,393 B1 | * | 4/2003 | Sugizaki et al. | 438/763 |
| 6,586,806 B1 | * | 7/2003 | Pai et al. | 257/401 |

\* cited by examiner

*Primary Examiner*—Mary Wilczewski
*Assistant Examiner*—Toniae M. Thomas
(74) *Attorney, Agent, or Firm*—Kevin D. Martin

(57) ABSTRACT

A sidewall oxidation process for use during the formation of a transistor such as a flash memory cell allows for improved control of a gate oxide profile. The method comprises doping transistor source and drain regions to different doping levels, then performing a transistor sidewall oxidation using a particular process to modify the gate oxide thickness. The oxide forms at a faster rate along the source sidewall than along the drain sidewall. By using ranges within the oxidation environment described, a source side gate oxide having a variable and selectable thickness may be formed, while forming a drain-side oxide which has a single thickness where a thinner layer is desirable. This leads to improved optimization of key competing requirements of a flash memory cell, such as program and erase performance, while maintaining sufficient long-term data retention. The process may allow improved cell scalability, shortened design time, and decreased manufacturing costs.

15 Claims, 6 Drawing Sheets

USE OF SELECTIVE OXIDATION TO FORM ASYMMETRICAL OXIDE FEATURES DURING THE MANUFACTURE OF A SEMICONDUCTOR DEVICE

FIELD OF THE INVENTION

This invention relates to the field of semiconductor manufacture and, more particularly, to a method for forming an asymmetrical gate oxide layer during the formation of a transistor on a semiconductor device such as a flash memory device.

BACKGROUND OF THE INVENTION

Floating gate memory devices such as flash memories include an array of electrically-programmable and electrically-erasable memory cells. Typically, each memory cell comprises a single n-channel metal oxide semiconductor (NMOS) transistor including a floating gate interposed between a control (input) gate and a transistor channel region. A layer of high-quality tunnel oxide used as gate oxide separates the transistor channel and the floating gate, and an oxide-nitride-oxide (ONO) dielectric stack separates the floating gate from the control gate. The ONO stack typically comprises a layer of silicon nitride ($Si_3N_4$) interposed between underlying and overlying layers of silicon dioxide ($SiO_2$). The underlying layer of $SiO_2$ is typically grown on the first doped polycrystalline silicon (polysilicon) layer. The nitride layer is deposited over the underlying oxide layer, and the overlying oxide layer can be either grown or deposited on the nitride layer. The ONO layer increases the capacitive coupling between the floating gate and the control gate, and reduces the leakage of current.

To program a flash cell, the drain region and the control gate are raised to predetermined potentials above a potential applied to the source region. For example 12, volts are applied to the control gate, 6.0 volts are applied to the drain, and 0.0 volts are applied to the source. These voltages produce "hot electrons" which are accelerated from the substrate across the gate oxide layer to the floating gate. Various schemes are used to erase a flash cell. For example, a high positive potential such as 12 volts is applied to the source region, the control gate is grounded, and the drain is allowed to float. More common erase bias conditions include: a "negative gate erase" in which –10V is applied to the control gate ($V_g$), 6V is applied to the source ($V_s$), a potential of 0V is applied to the body ($V_{body}$), and the drain is allowed to float ($V_d$); and a "channel erase" which comprises a $V_g$ of –9V, a $V_{body}$ of 9V, and a $V_s$ and $V_d$ of 9V or floating. In each case these voltages are applied for a timed period, and the longer the period the more the cell becomes erased. A strong electric field develops between the floating gate and the source region, and negative charge is extracted from the floating gate across the tunnel oxide to the source region, for example by Fowler-Nordheim tunneling.

In a flash memory device, the sources associated with each transistor within a sector are tied together, typically through the use of conductive doping of the wafer to form "source rails" which connect the sources of each transistor within a column. The columns within the sector are tied together using conductive plugs and a conductive line.

FIG. 1 depicts a cross section of transistors and other structures of a conventional flash electrically-erasable programmable read-only memory ($E^2PROM$) device. Additional elements may be present in an actual device which are not depicted for simplicity of explanation. FIG. 1 depicts a semiconductor substrate assembly comprising a semiconductor wafer 10, transistor source 12 and drain 14 diffusion regions within semiconductor wafer 10, gate (tunnel) oxide 16, floating gates 18 typically comprising a first polysilicon layer, capacitor dielectric 20 typically comprising an oxide-nitride-oxide (ONO) stack, control gate (word line) 22 typically comprising a second polysilicon layer, a transistor stack capping layer 24 typically comprising silicon nitride ($Si_3N_4$) or tetraethyl orthosilicate (TEOS), oxide or nitride spacers 26, a planar dielectric layer 28 such as borophosphosilicate glass (BPSG), digit line plugs 30 connected to drain regions 14, and a conductive line 32 typically comprising aluminum which electrically couples each plug 30 within a row of transistors.

During the formation of a flash memory transistor, a sidewall oxidation is performed subsequent to forming the gate stack, and typically after implanting the source junction. This sidewall oxidation repairs any damage to the tunnel oxide which may occur during the etch which forms the transistor gate stack. The sidewall oxidation effectively increases the thickness of the tunnel oxide, and does so in a non-uniform manner. For example, during the sidewall oxidation the tunnel oxide thickens more near the exposed edges of the floating gate and decreases toward the center of the gate stack. Near the center of the gate stack the tunnel oxide retains its original thickness with no increase during the sidewall oxidation, as this portion of the tunnel oxide is not exposed to the oxidizing ambient. Because of the physical appearance, this non-uniform profile is commonly termed a "smile profile."

The final profile resulting from the sidewall oxidation is dependent on the doping of both the polysilicon gate and that of the substrate. It is common for the doping of the source and drain regions to be different when this oxidation step occurs. Since the oxidation rate is sensitive to the doping of the substrate this will lead to a difference in the profile between the source and drain regions. When optimizing the performance of a flash cell, the thickening of the tunnel oxide over both of these regions is an important consideration. Since the source and drain regions have different functions in the operation of the flash cell, the ideal or optimized tunnel oxide profile over these junctions will also be different. Currently, if-optimization of one aspect of the cell performance requires a change to the profile over one of the junctions, for example the source, then the profile over the drain junction will follow in lock step. The oxidation rate of the drain will be different from that of the source due to the different doping concentration, but the ratio of the oxidation of the source to the drain is fixed for fixed doping concentrations. For example, if the oxidation target is increased by 20% for one side, there will be a similar increase of about 20% on the other side. When trying to optimize many performance aspects of the memory cell, this fixed relationship requires that trade-offs be made to reach an acceptable balance between improving some parameters and degrading others. For example, the gate oxide must be sufficiently thin on the drain side to allow electrons to pass from the drain to the floating gate during programming, but must be thick enough on the source side such that erase characteristics and resistance to leakage of a charge from the floating gate to the wafer are optimized.

Various methods and structures have been used which affect the arrangement of the source, drain, channel, and gate oxide. U.S. Pat. Nos. 5,192,872 and 5,604,366, both by Lee and assigned to Micron Technology, Inc., describe two such arrangements and are incorporated herein by reference as if set forth in their entirety.

The oxidation rate of silicon is affected by the type and concentration of dopants implanted in the silicon. For example, U.S. Pat. No. 4,409,723 describes that thermal oxidation rates over a heavily doped N+ region can be several times higher than the oxidation rate over a lightly P-doped region. U.S. Pat. No. 5,382,534 describes that the oxidation rate of doped silicon is from two to four times as fast as the rate for undoped silicon. Further, U.S. Pat. No. 6,251,751 describes an increasing silicon oxidation rate as the boron concentration increases.

A method for forming a local interconnect for a semiconductor device, and an inventive structure resulting from the method, which reduces or eliminates the problems described above by allowing variable oxidation ratio of two regions with different but fixed doping concentrations would be desirable.

SUMMARY OF THE INVENTION

The present invention provides a new method which, among other advantages, reduces problems associated with the operation of programmable read-only memory devices, particularly problems which may occur during reading and writing flash memory devices. In accordance with one embodiment of the invention the source region and drain region are doped to different doping levels, then exposed to a particular oxidizing ambient. The oxidizing ambient can be adjusted such that the source region oxidizes at a selected rate relative to the oxidizing rate of the drain region, rather than at a fixed rate as is found with previous processes. Thus for fixed doping levels of the source and drain regions, the thickness of the gate oxide at an edge of the transistor gate stack can be optimized on the source and drain side using a variable oxidation ratio.

The particular oxidizing ambient comprises a mixture of oxygen and hydrogen introduced into a chamber at a particular temperature and pressure. By adjusting the gas flows and other parameters as described below, the final thickness of the gate oxide on the source side can be selected for a desired thickness while maintaining a single final thickness of gate oxide on the drain side.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 2:
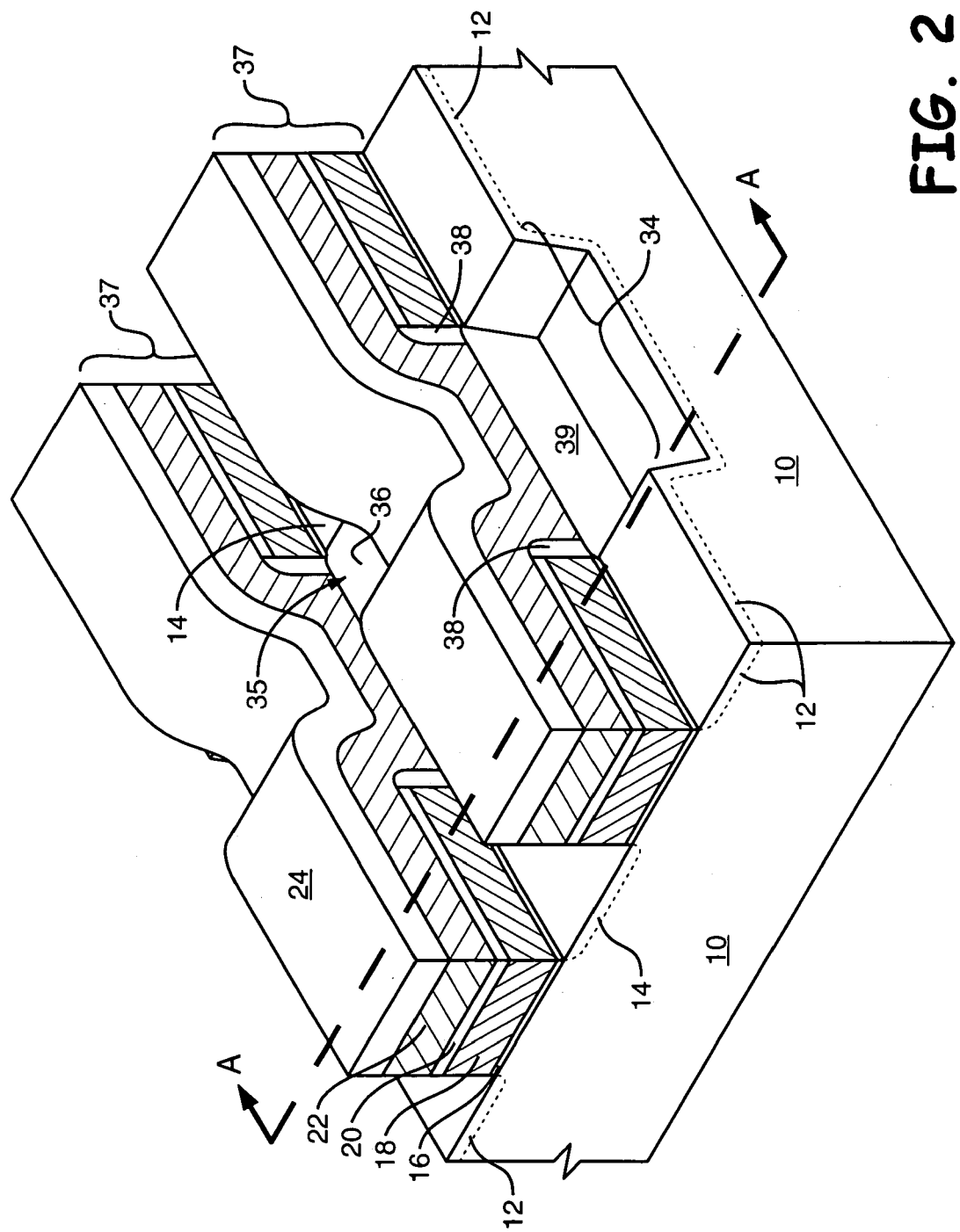
FIG. 2 is an isometric depiction of an in-process structure for practicing an embodiment of the invention.

FIG. 2 is an isometric figure depicting a starting structure for one embodiment of the present invention, and depicts a semiconductor wafer 10 having implanted source 12 and drain 14 regions with a channel region therebetween. During the formation of the FIG. 2 structure, prior to forming floating gates 18 and control gates 22, long, narrow trenches are etched into the wafer which extend across the wafer. FIG. 2 depicts portions 34, 35 of a trench, with the trench being filled with oxide 36 between adjacent drain regions 14 and further having oxide 39 beneath the portion of the control gates which do not overlie floating gates 18. The trenches 34 are filled with oxide, the transistor stacks 37 are formed and etched, the drains are patterned, then the oxide is removed from the trench portions where the transistor source rails 12 will be formed. After removing the oxide the wafer is implanted to form source rails 12, then the mask is removed to result in the FIG. 2 structure. Oxide 36 remains in the trench portions 35 between drain regions 14 along a column of transistors to electrically isolate the drains 14 of adjacent transistor stacks with shallow trench isolation 36. After removing the mask the wafer may be implanted again to form drain regions 14 and to further implant the source regions 12.

The source rails 12 as formed provide source regions for several transistors along two adjacent columns of transistors. FIG. 2 also depicts transistor gate stacks 37 each comprising gate (tunnel) oxide 16, a floating gate 18 typically formed from a first polysilicon layer, a dielectric layer 20 typically comprising a silicon nitride layer interposed between two silicon dioxide layers (ONO layer), a control gate (word line) 22 formed from a second polysilicon layer, and a dielectric capping layer 24. Dielectric spacers 38 prevent the control gate 22 from shorting with the floating gate 18. The structure may also comprise other features which are not immediately germane to the present invention and which are not individually depicted for simplicity of explanation, such as an conductive enhancement layer which improves the conductivity of the word line which formed at a location between control gate 22 and capping layer 24.

In the FIG. 2 embodiment, the source regions 12 are implanted with a dopant such as arsenic to between about 1E14 atoms/cm$^3$ and about 1E16 atoms/cm$^3$, and more particularly to about 3E15. Source regions 12 may also be optionally implanted with another dopant such as phosphorous to between about 1E13 to about 1E15, more particularly to about 4E14. Arsenic aids with channel erase, and arsenic and phosphorous aid with source erase and negative gate erase. At this point in this embodiment of the process the drains 14 are not doped with arsenic or phosphorous but may have other dopants from previous processes to a level similar to doping of the channel, for example, with a p-type dopant such as boron to between about 1E16 to 1E19 atoms/cm$^3$ and more particularly to between about 1E18 to about 3E18 atoms/cm$^3$. The particular aspect of this embodiment is that the source region 12 at a location adjacent the gate oxide 16 is more heavily implanted with n-type dopants than is the drain region 14 at a location adjacent the gate oxide 16.

The structure of FIG. 2 is exposed to a particular oxidizing ambient to oxidize the exposed portions of the semiconductor wafer. While this process oxidizes all exposed portions of the wafer, as well as any exposed portions of the polysilicon control and floating gates, the step is performed specifically to oxidize the wafer near the transistor gate at the source and drain sides. Because of the heavier doping concentration at the source as compared to the drain, exposure to the particular oxidizing ambient discussed below results in the source oxidizing at a faster rate than the drain. Additionally, the particular oxidizing ambient can be modified to provide various source-to-drain oxidation ratios which aids with optimizing program and erase characteristics. Thus in contrast with prior processes, the source-to-drain oxidation ratio is not fixed with a fixed source and drain doping concentration. The oxidation of the wafer results in a thicker oxide layer on the source side 12 of the transistor stack 37 than on the drain side 14. As the wafer oxidizes, the oxide encroaches between the gate oxide and the floating gate from both the source 12 and drain 14 sides.

Figure 1:
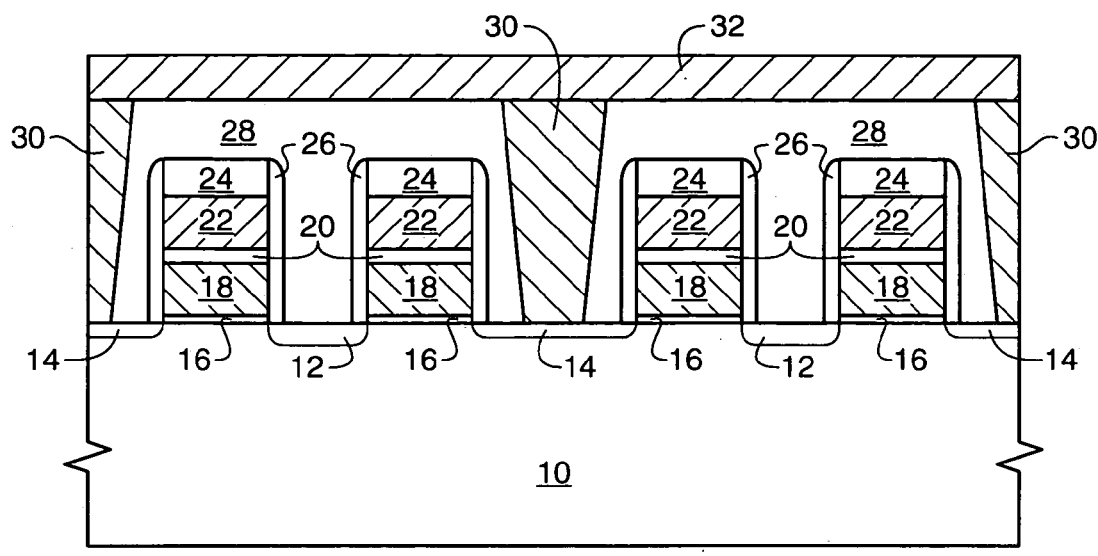
FIG. 1 is a cross section depicting a portion of a conventional flash memory device.
Figure 3:
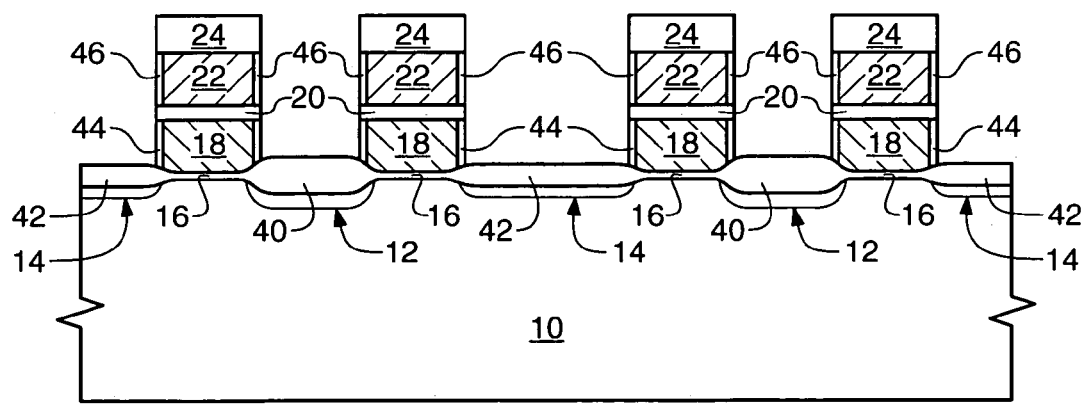
FIG. 3 is a cross section of the FIG. 2 structure along A—A subsequent to oxidizing source and drain regions using an embodiment of the present invention and, for purposes of illustration, further depicts an additional transistor stack on either side of the FIG. 2 cross section.

FIG. 3 is a cross section at A—A of FIG. 2 after the oxidation process, and, for purposes of illustration, further depicts an additional transistor stack on either side of the FIG. 2 cross section. FIG. 3 depicts the result of oxidation of the source 12 and drain 14 to form oxide 40 over the source region 12 and oxide 42 over the drain region 14. As depicted, the effect of the oxidation is to space the source edge of the floating gate 18 further from the source than it spaces the drain edge of the floating gate from the drain. That is, the oxidation over the source junction thickens to a greater degree than the oxidation over the drain junction. This allows programming of the floating gate from the drain side through the relatively thin oxide which spaces the floating gate and the drain while balancing erase characteristics with the reduction in leakage from the floating gate to the source. FIG. 3 further depicts oxide 44 formed from oxidizing the floating gate 18 and oxide 46 from oxidizing the control gate 22 during exposure of the source 12 and drain 14 regions to the oxidizing ambient.

The oxidizing ambient of this embodiment of the present invention is a particular oxidizing ambient. As described above, with previous processes the ratio of the amount of oxidation between two differentially doped silicon features is fixed. For example, if a first doped region oxidizes at a rate which is four times the oxidation rate of a second doped region, it will oxidize four times faster for other oxidizing ambients. In other words, a graph of the log of their oxidation rates for various oxidizing environments would produce generally parallel curves. With the present process embodiment, the ratio of oxidation may be changed to optimize the thickness of the oxide under the floating gate on the drain side for programming, and on the source side for erase or to reduce leakage to the source.

Thus with the oxidizing ambient of the present embodiment of the invention, the oxidation ratio between the two differentially-doped regions is not fixed. The oxidation rates can be adjusted by controlling, for example, the temperature and the ratio of hydrogen gas to oxygen gas. This allows control of the partial pressure of water vapor (steam) and hydrogen gas in the reactor during the selective oxidation process. While the partial pressure of steam appears to be proportional to the doped:undoped oxidation ratio, the partial pressure of steam may merely correlate with the oxidation ratio while not directly determining the ratio.

Table 1 depicts various exemplary conditions for one embodiment of the present process. A silicon wafer having a first location, for example a transistor drain, which is undoped with arsenic or phosphorous (but may be implanted with other dopants as discussed above) and a second wafer location, such as a transistor source, which is doped with arsenic to a concentration of between about 1E14 atoms/cm$^3$ to about 1E16 atoms/cm$^3$ and, optionally, phosphorous to a concentration of between about 1E13 atoms/cm$^3$ to about 1E15 atoms/cm$^3$ is placed into a reactor. A typical reactor is an Applied Materials Centura etch chamber, and the conditions may be modified for other types of reactors. In each condition the temperature is maintained at between about 700° C. to about 1100° C., and more particularly to between about 900° C. and about 950° C. and the pressure is maintained at between about 5 millitorr (mTorr) to about 2,000 Torr, and more preferably to between about 760 Torr and about 820 Torr. The table below has been normalized for an arbitrary drain oxide thickness of 40 angstroms (Å). The actual target thickness may vary depending on the desired performance of the cell, and for present processes will be between about 5 Å to about 100 Å, and more typically between about 30 Å and about 40 Å. Column 1 lists the flow rate of hydrogen gas in standard liters/minute (SLM), column 2 is the flow rate of oxygen gas in SLM, column 3 is the volumetric ratio of water (steam) to hydrogen gas which forms in the chamber, column 4 is the partial pressure of water (steam) in the chamber, column 5 is the thickness of the silicon dioxide which forms over the doped (source) portion of the silicon wafer, column 6 is the thickness of the silicon dioxide which forms over the undoped (drain) portion of the silicon wafer, and column 7 is the value of column 5 divided by the value in column 6.

TABLE 1

Exemplary Silicon Dioxide Formation Conditions and Rates

| H$_2$ Flow (SLM) | O$_2$ Flow (SLM) | H$_2$O/H$_2$ by Volume | H$_2$O pP | Source (Å) | Drain (Å) | Source/Drain |
|---|---|---|---|---|---|---|
| 10 | 0.24 | 0.05042 | 0.047619 | 150.73 | 40 | 3.76825 |
| 10 | 0.65 | 0.149425 | 0.130435 | 179.32 | 40 | 4.483 |
| 7.7 | 0.25 | 0.069444 | 0.259259 | 193.94 | 40 | 4.8485 |
| 5.1 | 0.25 | 0.108696 | 0.833333 | 224.75 | 40 | 5.61875 |

As can be determined from Table 1, the source-to-drain oxidation ratio can be selected by varying the process parameters. With the present embodiment of the process, the doped region can be oxidized between about 3.8 times the rate of the undoped region to more than 5.5 times the rate of the undoped region. The $H_2$ flow rate may range from between about 0.01 SLM and about 20 SLM, and more particularly between about 5 SLM and about 10 SLM. The $O_2$ flow rate may range from between about 0.001 SLM and about 5 SLM, and more particularly between about 0.24 SLM to about 0.65 SLM.

Figure 4:
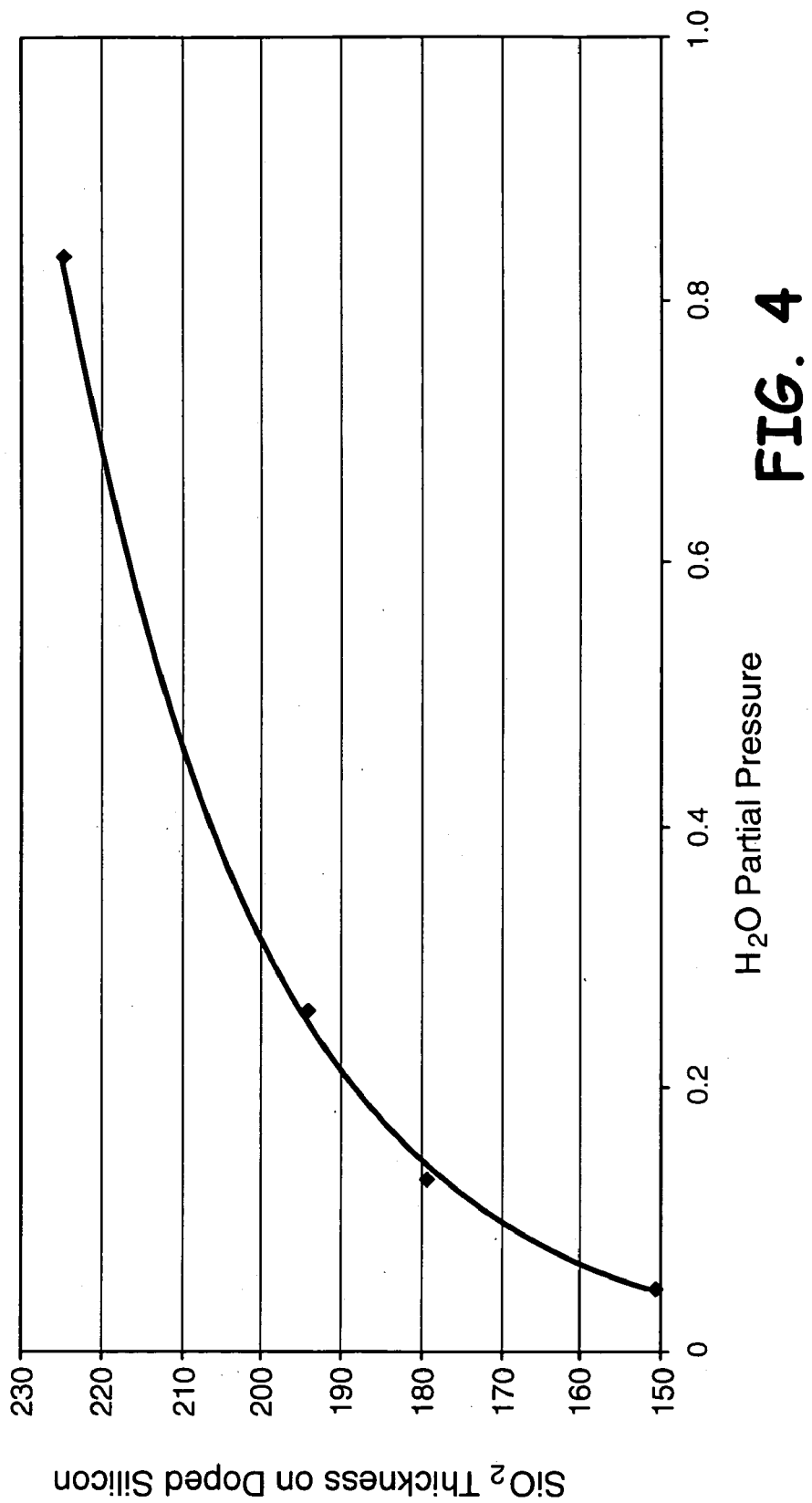
FIG. 4 charts a thickness of silicon dioxide formed over the source region subsequent to its oxidation as a function of partial pressure of $H_2O$ gas.

FIG. 4 depicts the oxidation thickness of the doped region as a function of the partial pressure of the steam. The oxide forms over the doped region at a faster rate when compared with the oxidation of the undoped region as the partial pressure of the $H_2O$ increases. To reiterate, the oxidation of the undoped region is maintained at 40 Å for illustration of the present process.

Figure 5:
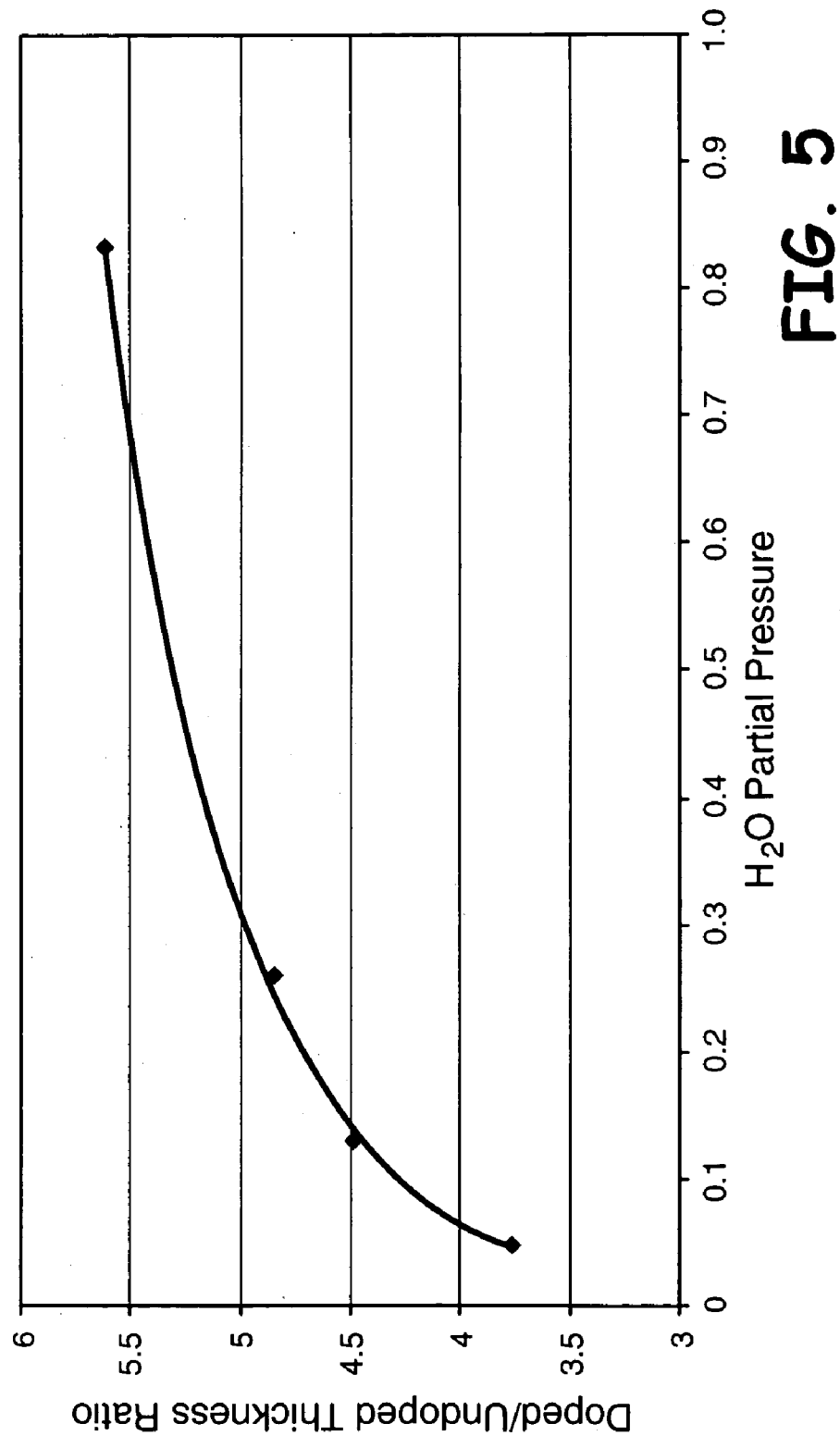
FIG. 5 charts a doped silicon:undoped silicon ratio as a function of partial pressure of $H_2O$ gas.

FIG. 5 depicts the doped to undoped thickness ratio as a result of the partial pressure of $H_2O$. As the partial pressure of $H_2O$ increases from about 0.05 to about 0.85, the doped: undoped thickness ratio increases from about 3.75 to about 5.5.

With prior technology, to achieve a desired source:drain oxide thickness ratio required doping of the source and drain to fixed levels. In the alternative, doping the source and drain to desired levels may have resulted in oxide over the source and drain which had a less than desirable thickness. Thus there was a tradeoff between doping concentrations of the source and drain and the thickness of the oxide subsequent to oxidizing the source and drain. The present invention allows doping of the source and drain to desired levels while also allowing control of the oxide thickness ratio of the source verses the drain.

Figure 6:
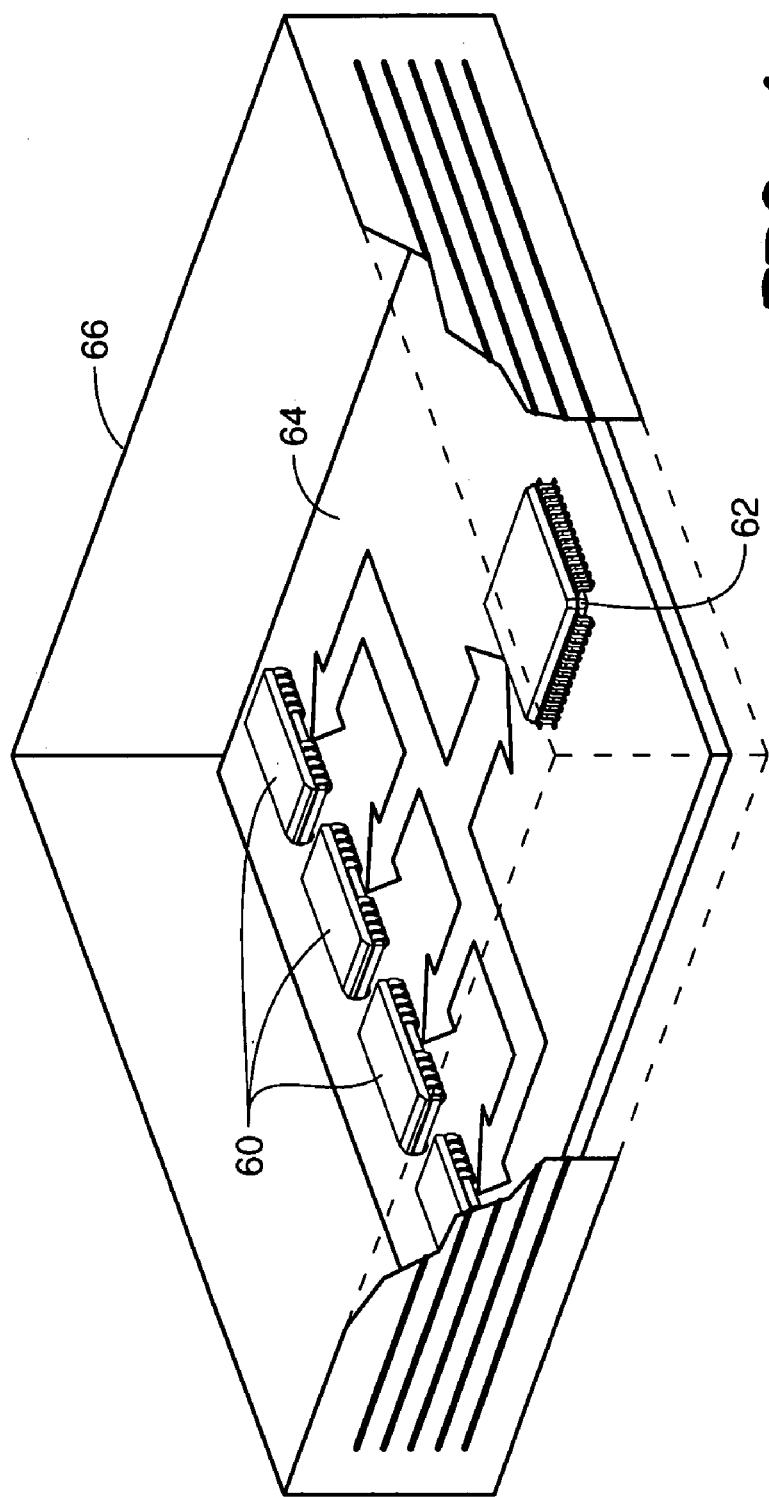
FIG. 6 is an isometric depiction of a use of the invention in an electronic device.

As depicted in FIG. 6, a semiconductor device 60 formed in accordance with the invention may be attached along with other devices such as a microprocessor 62 to a printed circuit board 64, for example to a computer motherboard or as a part of a memory module used in a personal computer, a minicomputer, or a mainframe 66. FIG. 6 may also represent use of device 60 in other electronic devices comprising a housing 66, for example devices comprising a microprocessor 62, related to telecommunications, the automobile industry, semiconductor test and manufacturing equipment, consumer electronics, or virtually any piece of consumer or industrial electronic equipment.

Figure 7:
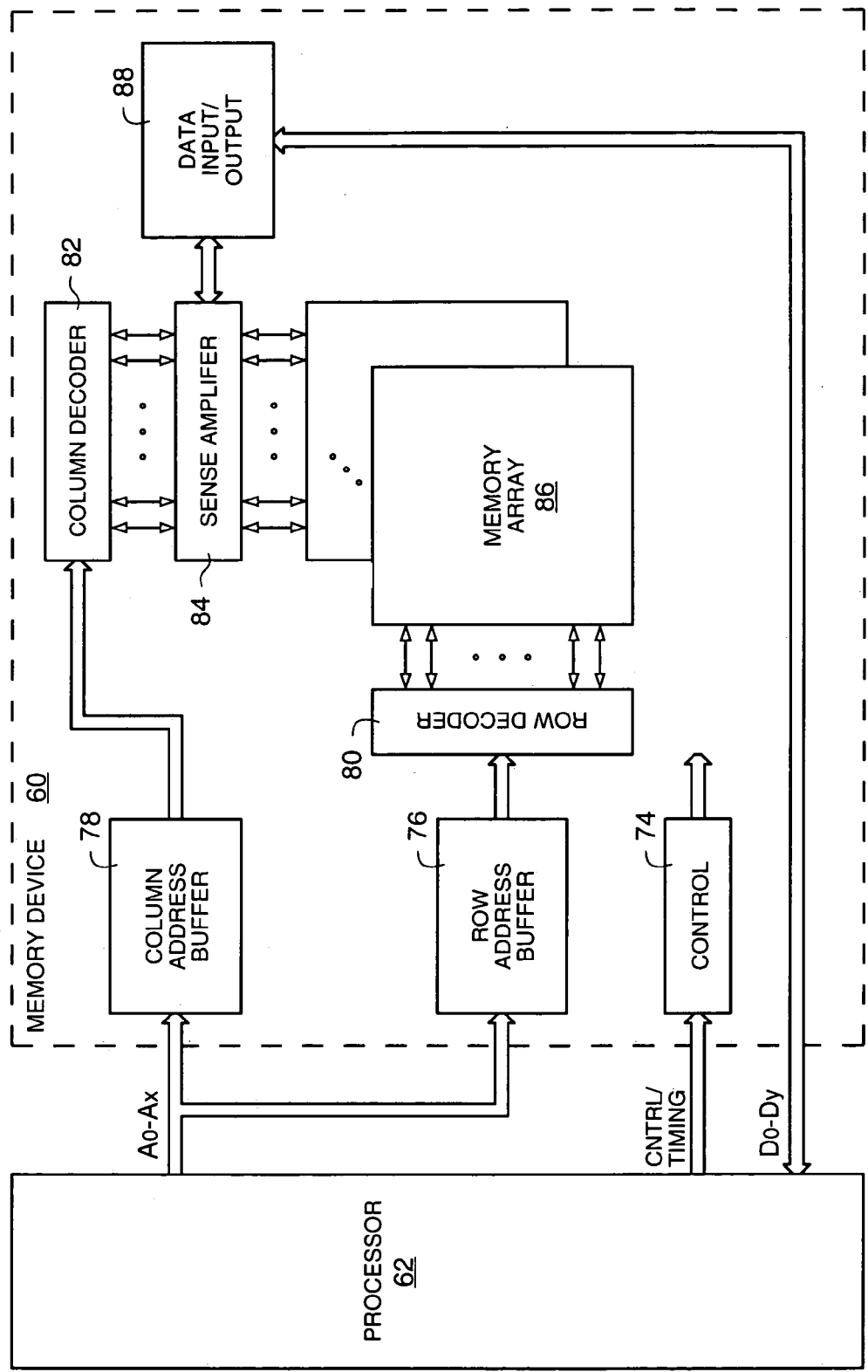
FIG. 7 is a block diagram of an exemplary use of the invention to form part of a transistor array in a flash memory device.

The process and structure described herein can be used to manufacture a number of different structures which comprise a transistor, for example a flash memory device. FIG. 7, for example, is a simplified block diagram of a memory device such as a flash memory having a memory array with transistors which may be formed using an embodiment of the present invention. The general operation of such a device is known to one skilled in the art. FIG. 7 depicts a processor 62 coupled to a memory device 60, and further depicts the following basic sections of a memory integrated circuit: control circuitry 74; row 76 and column 78 address buffers; row 80 and column 82 decoders; sense amplifiers 84; memory array 86; and data input/output 88.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used during the formation of a semiconductor device comprising:
   implanting a first region of a semiconductor material with a dopant to a first concentration and implanting a second region of the semiconductor material with the dopant to a second concentration, wherein the first concentration is greater than the second concentration; and
   exposing the first and second regions of the semiconductor material to an oxidizing ambient comprising:
   a partial pressure of steam, wherein the partial pressure of steam is proportional to an oxidation ratio of the first region to the second region, and wherein the oxidation ratio is greater than one and variable with variations in the oxidizing ambient;
   a temperature of between about 700° C. and about 1100° C.;
   a hydrogen gas ($H_2$) flow rate of between about 0.01 SLM and about 20 SLM;
   an oxygen gas ($O_2$) flow rate of between about 0.001 SLM and about 5 SLM; and
   a volumetric ratio of $H_2O$ vapor to $H_2$ gas of between about 0.05 to about 0.15.

2. The method of claim 1 wherein the oxidizing ambient further comprises a pressure of between about 5 mTorr and about 2,000 Torr.

3. A method for forming a flash memory device comprising:
   forming at least a portion of a transistor device comprising a doped source region, a doped drain region, a gate oxide layer, and a floating gate layer, wherein the source region is more heavily doped than the drain region;
   exposing the source region and the drain region to an oxidizing ambient which oxidizes the source region at a faster rate than the drain region, wherein the oxidizing ambient is selected to produce an oxidation ratio of the source region to the drain region, wherein the oxidation ratio is variable and greater than one depending on the oxidizing ambient selected.

4. The method of claim 3 wherein the oxidizing ambient is selected to produce a desired partial pressure of steam to select the ratio.

5. The method of claim 3 wherein the oxidizing ambient comprises:
   a hydrogen gas ($H_2$) flow rate of between about 5.0 SLM and about 10 SLM; and
   an oxygen gas ($O_2$) flow rate of between about 0.24 SLM and about 0.65 SLM.

6. The method of claim 3 wherein the oxidizing ambient further comprises a volumetric ratio of $H_2O$ vapor to $H_2$ gas of between about 0.05 to about 0.15.

7. The method of claim 6 wherein the oxidizing ambient further comprises a pressure of between about 760 Torr and about 820 Torr.

8. The method of claim 3 wherein as the source and drain regions oxidize during the exposure of the source region and the drain region to the oxidizing ambient, the oxide encroaches between the gate oxide and the floating gate from the source region and from the drain region.

9. The method of claim 8 further comprising doping the source region with a dopant to a concentration of between about 1E14 atoms/cm$^3$ and about 1E16 atoms/cm$^3$, and doping the drain region with the dopant to a concentration of between about 1E13 atoms/cm$^3$ and about 1E15 atoms/cm$^3$, wherein the source region is doped to a higher doping concentration than the drain region.

10. The method of claim 9 wherein the oxidation ratio of the source region to the drain region is between about 3.8 and about 5.5.

11. A method used to simultaneously oxidize a first semiconductor region having a first doping concentration and a second region having a second doping concentration which is lower than the first doping concentration, comprising the following steps:
   placing the first and second semiconductor regions into an oxidation chamber;
   in the oxidation chamber, exposing the first and second semiconductor regions to an oxidizing ambient comprising:
      a temperature of between about 700° C. and about 1100° C.;
      a hydrogen gas ($H^2$) flow rate of between about 5.0 SLM and about 10 SLM;
      an oxygen gas ($O_2$) flow rate of between about 0.24 SLM and about 0.65 SLM, wherein a volumetric ratio of $H_2O$ vapor to $H_2$ gas is between about 0.05 and about 0.15; and
      a pressure of between about 760 Torr and about 820 Torr,
   wherein an oxidation ratio of the first semiconductor region to the second semiconductor region is greater than one and is variable and selectable with variations in the oxidizing ambient.

12. The method of claim 11 further comprising doping the first semiconductor region with an n-type dopant to a concentration of between about 1E14 atoms/cm$^3$ and about 1E16 atoms/cm$^3$ prior to exposing the first and second semiconductor regions to the oxidizing ambient.

13. The method of claim 12 wherein the second semiconductor region is doped with a p-type dopant to a concentration of between about 1E18 to about 3E18 atoms/cm$^3$.

14. The method of claim 12 wherein the oxidation ratio of the first semiconductor region to the second semiconductor region is between about 3.8 and about 5.5.

15. A method used during the formation of a semiconductor device comprising:
   implanting a first region of a semiconductor material with a dopant to a first concentration and implanting a second region of the semiconductor material with the dopant to a second concentration, wherein the first concentration is greater than the second concentration; and
   exposing the first and second regions of the semiconductor material to an oxidizing ambient comprising a partial pressure of steam, wherein the partial pressure of steam is proportional to an oxidation ratio of the first region to the second region, and a volumetric ratio of $H_2O$ vapor to $H_2$ gas is between about 0.05 to about 0.15, and the oxidation ratio is greater than one and variable with variations in the oxidizing ambient.

* * * * *